US009660154B2

(12) United States Patent
Akram et al.

(10) Patent No.: US 9,660,154 B2
(45) Date of Patent: May 23, 2017

(54) CHIP SCALE LIGHT EMITTING DEVICE PACKAGE WITH DOME

(71) Applicant: KONINKLIJKE PHILIPS N.V., Eindhoven (NL)

(72) Inventors: Salman Akram, Eindhoven (NL); Jyoti Kiron Bhardwaj, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/892,193

(22) PCT Filed: May 5, 2014

(86) PCT No.: PCT/IB2014/061198
§ 371 (c)(1),
(2) Date: Nov. 18, 2015

(87) PCT Pub. No.: WO2014/188296
PCT Pub. Date: Nov. 27, 2014

(65) Prior Publication Data
US 2016/0118554 A1  Apr. 28, 2016

Related U.S. Application Data

(60) Provisional application No. 61/825,116, filed on May 20, 2013.

(51) Int. Cl.
*H01L 33/54* (2010.01)
*H01L 33/00* (2010.01)
(Continued)

(52) U.S. Cl.
CPC .......... *H01L 33/54* (2013.01); *H01L 33/0079* (2013.01); *H01L 33/486* (2013.01);
(Continued)

(58) Field of Classification Search
CPC .......... H01L 33/54; H01L 33/62; H01L 33/21
See application file for complete search history.

(56) References Cited

U.S. PATENT DOCUMENTS 7,344,952 B2 *  3/2008  Chandra .............. H01L 33/505
257/E21.352
8,338,849 B2 * 12/2012  Tischler .................. H01L 51/50
257/98

(Continued)

FOREIGN PATENT DOCUMENTS

EP    2197051 A2    6/2010
WO  2009075530 A2   6/2009
(Continued)

OTHER PUBLICATIONS

EPO as ISA, PCT/IB2014/061198, filed May 5, 2014, "International Search Report and Written Opinion" dated Aug. 1, 2014, 13 pages.

*Primary Examiner* — Calvin Choi
*Assistant Examiner* — S. M. S Imtiaz

(57) ABSTRACT

Light Emitting Devices (LEDs) are fabricated on a wafer substrate with one or more thick metal layers that provide structural support to each LED. The streets, or lanes, between individual LEDs do not include this metal, and the wafer can be easily sliced/diced into singulated self-supporting LEDs. Because these devices are self-supporting, a separate support submount is not required. Before singulation, further processes may be applied at the wafer-level; after singulation, these self-supporting LEDs may be picked and placed upon an intermediate substrate for further processing as required. In an embodiment of this invention, protective optical domes are formed over the light emitting devices at the wafer-level or while the light emitting devices are situated on the intermediate substrate.

12 Claims, 4 Drawing Sheets

(51) Int. Cl.
*H01L 33/48* (2010.01)
*H01L 33/50* (2010.01)
*H01L 33/60* (2010.01)

(52) U.S. Cl.
CPC ............ *H01L 33/502* (2013.01); *H01L 33/60* (2013.01); *H01L 2933/005* (2013.01); *H01L 2933/0041* (2013.01); *H01L 2933/0058* (2013.01)

(56) References Cited

U.S. PATENT DOCUMENTS

| | | | | |
|---|---|---|---|---|
| 2002/0172244 | A1* | 11/2002 | Li | H01S 5/0201 372/36 |
| 2008/0074032 | A1* | 3/2008 | Yano | F21S 6/003 313/503 |
| 2010/0003788 | A1* | 1/2010 | Wang | H01L 23/3677 438/118 |
| 2010/0081218 | A1* | 4/2010 | Hardin | H01L 33/508 438/7 |
| 2011/0151626 | A1* | 6/2011 | Lin | H01L 33/486 438/118 |
| 2011/0297987 | A1* | 12/2011 | Koizumi | H01L 33/44 257/98 |
| 2012/0193648 | A1* | 8/2012 | Donofrio | H01L 33/508 257/88 |
| 2013/0214285 | A1* | 8/2013 | Stauss | H01L 33/007 257/76 |
| 2016/0082688 | A1* | 3/2016 | Nakai | B29C 39/148 428/141 |

FOREIGN PATENT DOCUMENTS

| | | |
|---|---|---|
| WO | 2013084155 A1 | 6/2013 |
| WO | 2013175338 A1 | 11/2013 |

* cited by examiner

CHIP SCALE LIGHT EMITTING DEVICE PACKAGE WITH DOME

CROSS-REFERENCE TO RELATED APPLICATIONS

The present application is a §371 application of International Application No. PCT/IB2014/061198 filed on May 5, 2014 and entitled "Chip Scale Light Emitting Device Package with Dome," which claims the benefit of U.S. Provisional Application Ser. No. 61/825,116, filed May 20, 2013. Both PCT/IB2014/61198 and U.S. 61/825,116 are incorporated herein.

FIELD OF THE INVENTION

This invention relates to the field of light emitting devices, and in particular to a method for producing chip scale light emitting devices with optical domes.

BACKGROUND OF THE INVENTION

Thin-Film light emitting devices, including thin-film flip-chip devices, are conventionally tested, singulated (diced), then attached to a submount, typically via a pick-and-place process that attaches hundreds of light emitting dies on the submount. The submount provides the structure required to support the individual light emitting dies, and the electrical circuitry that allows an external power source to be coupled to the light emitting dies. The submount also allows for subsequent processes, such as lamination and encapsulation, to be applied to all of the devices on the submount concurrently, significantly reducing fabrication costs. After such processing, the submount with finished light emitting devices is subsequently sliced/diced ("singulated") to produce individual light emitting devices that can be placed in lamps, attached to printed circuit boards, and so on.

The singulation of the light emitting devices on the submount, however, is hampered by the structural support provided by the submount. The slicing apparatus must be able to cut through the submount, and a submount that is sufficiently thick and/or rigid to structurally support a group of light emitting devices through the lamination process is more difficult to slice than a non-structural substrate.

SUMMARY OF THE INVENTION

It would be advantageous to provide finished light emitting devices without requiring a structurally supporting submount that must be sliced.

To better address one or more of these concerns, in an embodiment of this invention, the LEDs are fabricated on a wafer substrate with one or more thick metal layers that provide structural support to each LED. The streets, or lanes, between individual LEDs do not include this metal, and the wafer can be easily sliced/diced into singulated self-supporting LEDs. Because these devices are self-supporting, a separate support submount is not required. Before singulation, further processes may be applied at the wafer-level; after singulation, these self-supporting LEDs may be picked and placed upon an intermediate substrate for further processing as required. In an embodiment of this invention, protective optical domes are formed over the light emitting devices at the wafer-level or while the light emitting devices are situated on the intermediate substrate.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

FIGS. 1A-1E illustrate an example fabrication of a self-supporting light emitting device, as disclosed in copending U.S. patent application 61/568,297, "FORMING THICK METAL LAYERS ON A SEMICONDUCTOR LIGHT EMITTING DEVICE", filed 8 Dec. 2011 for Alexander Nickel, Jim Lei, Anneli Munkholm, Grigoriy Basin, Sal Akram, and Stefano Schiaffino, and incorporated by reference herein.

Figure 1A:
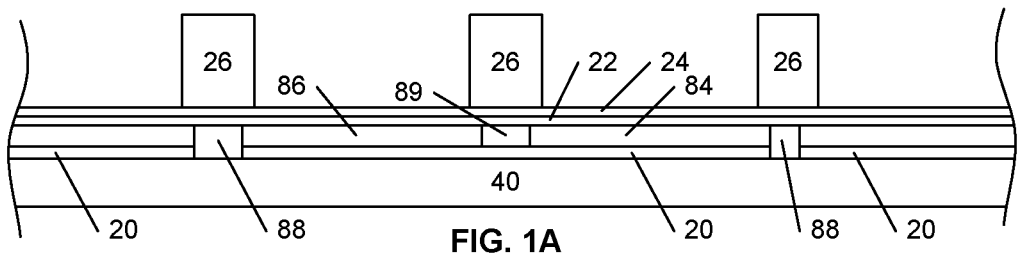
FIGS. 1A-1E illustrate an example fabrication of a self-supporting light emitting device.

As illustrated in FIG. 1A, a light emitting structure 20 is formed on a substrate 40. The substrate 40 may be a wafer upon which hundreds or thousands of light emitting structures are formed. The light emitting structure 20 may comprise, for example, an active layer that is sandwiched between an n-type region and a p-type region, and the substrate 40 may be comprised of a sapphire, SiC, Si, GaN, or composite substrate. Metal pads 84 and 86 provide electrical contact to the n-type and p-type regions, and are separated by a gap 89, which may be filled with an insulating material such as a dielectric, an oxide or nitride of silicon, air, or ambient gas. The light emitting structure 20 with accompanying pads 84 and 86 may be formed using any of a variety of techniques common in the art.

In embodiments of this invention, thick metal layers are formed above the pads 84, 86. To facilitate the formation of these thick metal layers, two base layers 22, 24 may be formed above the pads 84, 86. The base layer 22 may be a conductive adhesion layer, and may include, for example, Ti, W, and alloys such as TiW. The base layer 24 may be a seed layer on which the thick metal layers may be formed. For example, if the thick metal layers are formed by copper plating, the seed layer 24 may be copper.

The base layers 22, 24 may be formed to cover the entire surface of the wafer of semiconductor devices, and subsequently etched to electrically isolate the pads, or they may be patterned to isolate regions of the light emitting structure 20, as detailed further below.

A removable material 26, such as a photoresist, may be applied in a select pattern to provide distinct regions upon which the thick metal layers are formed. As illustrated, the removable material may be coincident with the gaps 89 between the pads 84, 86. This removable material may also be placed in the regions ("streets" or "lanes") between the individual light emitting structures 20.

Figure 1B:
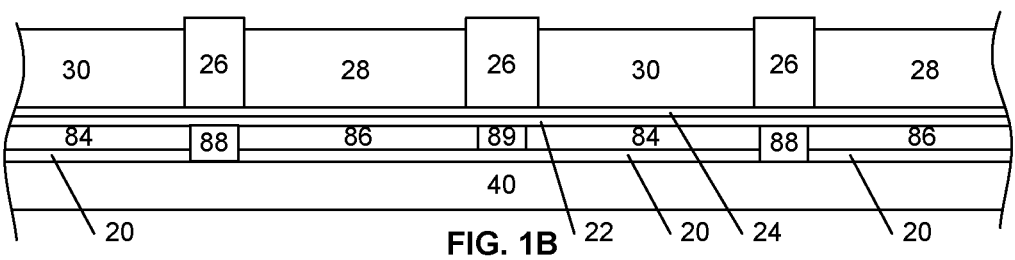

In FIG. 1B, the thick metal layers 28, 30 may be formed in the regions defined by the removable material 26; as illustrated the metal layer 28 is above the pad 86 and the metal layer 30 is above the pad 84. The thickness of these layers 28, 30 may be greater than 50 microns in some embodiments, and greater than 100 microns in some embodiments.

Other techniques may be used to form thick metal elements to support the light emitting structure 20 and provide conductivity to each of the pads 84, 86 of these structures. In copending U.S. patent application 61/656,691, "CHIP SCALE LIGHT EMITTING DEVICE WITH METAL PILLARS IN A MOLDING COMPOUND FORMED AT WAFER LEVEL", filed 7 Jun. 2012, for Jipu Lei, Stefano Schiaffino, Alexander Nickel, Mooi Guan Ng, Grigoriy Basin, and Sal Akram, and incorporated by reference herein, discloses the creation of multiple pillars upon the pads 84, 86, and embedding these pillars in a molding compound. The pillars provide the mechanical support and conductivity, while the molding compound prevents distortions in the pillar structure.

The conductive base layers 22, 24 electrically couple these thick metal layers 28, 30 to the pads 84 and 86, respectively. Optionally, either or both of the base layers 22, 24 may be coupled directly to the light emitting element 20, serving a dual role as connector pad and base/seed layer; similarly, the pads 84 and 86 may comprise the seed material, obviating the need for the base layers 22, 24.

In this example embodiment, the conductive base layers 22, 24 extend across the entire wafer 40, and thus create a conductive path among all of the pads 84, 86 of all of the light emitting elements.

Figure 1C:
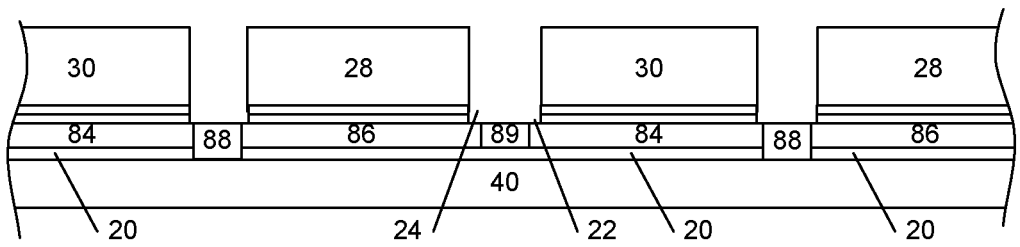

In FIG. 1C, the removable material 26 is removed, exposing the base layers 22, 24 in the regions between the pads 84, 86 and in the streets between devices on the wafer. The exposed regions of the base layers 22, 24 may be removed by conventional etching, creating electrically isolated thick metal regions 28, 30 atop the pads 86, 84.

One of skill in the art will recognize that if the conductive base layers 22, 24 had been patterned to be situated only atop the pads 84, 86, the removal and etching process need not be performed. Likewise, patterning the conductive base layers 22, 24 may permit connections within groups of light emitting elements.

Figure 1D:
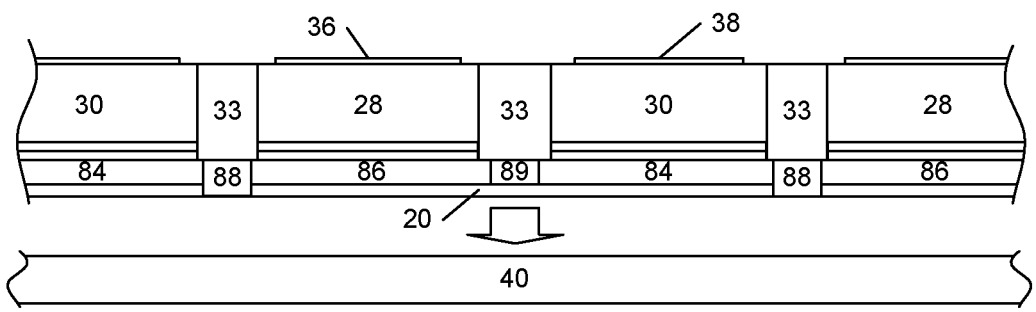

In FIG. 1D, if the material 26 has been removed, an electrically insulating material 33 may be formed over the wafer, providing support between the thick metal regions 28, 30, and between the individual light emitting devices on the wafer. This material 33 may be reflective, to reduce absorption of light that may be directed toward this material. This material 33 may be applied over the entire surface of the wafer, then planed or etched to expose the metal regions 28, 30 using conventional techniques, such as microbead blasting, fly cutting, cutting with a blade, or chemical mechanical polishing. If the layers 22, 24 has been patterned and the material 26 did not need to be remove, the material 26 forms the illustrated material 33.

As illustrated in FIG. 1D, metal contact pads 36, 38 may be formed on the thick metal layers 28, 30, to facilitate connection to a structure such as a PC board, for example by reflow-soldering. Contact pads 36 and 38 may be, for example, gold microbumps or solder, and may be formed by any suitable technique, including, for example, plating or screen printing.

The substrate 40 may be removed, exposing the surface of the light emitting structure 20 from which light will be emitted when the device 100 (shown in FIG. 1E) is externally powered via the pads 36, 38. The light emitting surface of the light emitting structure 20 may be roughened to enhance the extraction of light, thereby improving the light output efficiency. In the alternative, substrate 40 may be transparent to the light emitted by the light emitting structure 20 and may remain in place. The substrate 40 may include features that facilitate extraction of light from the light emitting structure 20 into the substrate 40; for example, the substrate 40 may be a patterned sapphire substrate (PSS) upon which the light emitting structure 20 is grown.

Figure 1E:
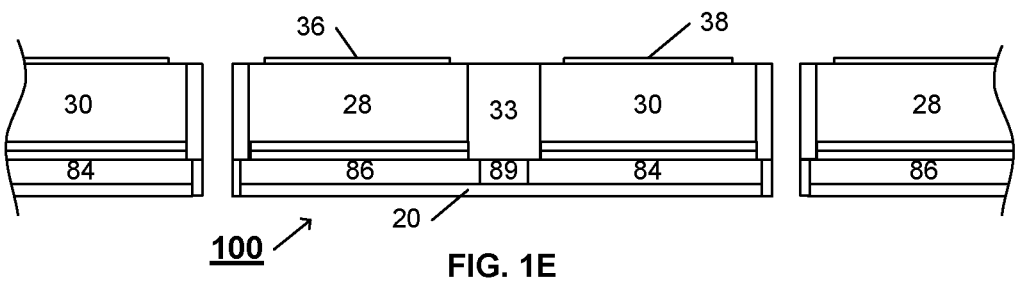

As illustrated in FIG. 1E, the individual devices 100 may be singulated, using, for example, laser scribing and dicing. Of particular note, because the thick metal regions 28, 30 do not extend into the streets between the devices 100, conventional semiconductor dicing techniques may be used.

When the substrate 40 is removed, each individual device 100 will have sufficient structural integrity to be self-supporting for subsequent processes, and in particular, to be self-supporting during the encapsulation of the device 100 with a protective optical material, such as a transparent dome, as illustrated in FIGS. 2A-2B, FIGS. 3A-3E, and FIGS. 4A-4E.

Figure 2A:
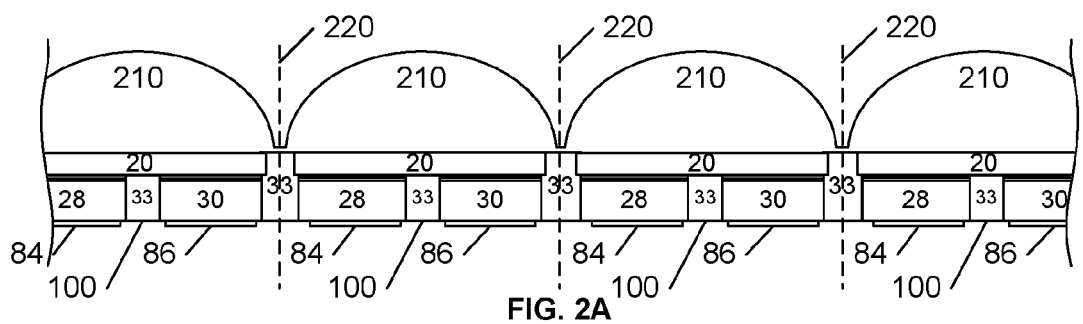
FIGS. 2A-2B illustrate example encapsulations of self-supporting light emitting devices at the wafer level.
Figure 2B:
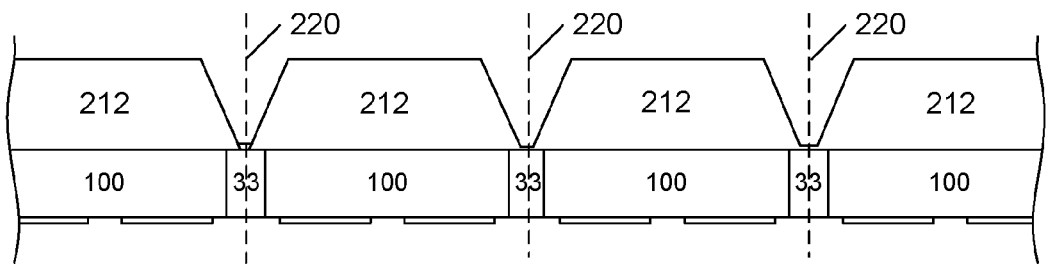

FIGS. 2A-2B illustrate example encapsulations of self-supporting light emitting devices at the wafer level. In these and subsequent figures, each self-supporting structure of light emitting element 20, thick metal layers 28, 30, insulating material 33, and pads 84, 86 is referenced to as a light emitting device 100.

FIG. 2A illustrates an example formation of hemispherical domes 210 above the light emitting devices 100 while these devices 100 are at the wafer-level; that is, before the concurrently formed light emitting elements 20 with thick metal layers 28, 30 are separated from each other. These domes 210 are intended to provide protection to the light emitting devices, as well as optical coupling of the light produced by the light emitting device 100 to regions outside each dome 210. In some embodiments, the domes are formed using a transparent epoxy, silicone, glass, or other material providing an optical coupling between the light emitting device and the regions exterior to the dome 210. In some embodiments, the material comprising the dome 210 includes one or more wavelength conversion materials, such as phosphors, that convert some or all of the light emitted from the light emitting device 100 into a different wavelength (color). In other embodiments, a layer of wavelength conversion material may be formed on the light emitting elements 20 before the domes 210 are formed. The dome 210 may also comprise multiple layers of materials that provide different optical or other functions, such as changing the apparent color of the wavelength conversion material.

Although the formation of these domes 210 is well suited for an 'in-situ' molding of the lenses over the wafer comprising the light emitting elements 100, wherein the material of the domes 210 is applied in a fluid form, then hardened within a mold, other techniques for forming these domes are available to one of skill in the art. For example, pre-formed (pre-molded) sheets of adjacent domes 210 may be formed, and then aligned and adhered to the wafer comprising the light emitting elements 100.

After forming these hemispherical domes 210, the individual light emitting devices 100 with optical domes 210 may be singulated along the indicated cutting lines 220 using conventional slicing/dicing techniques, including, for example, mechanical sawing or cutting, laser cutting, and so on, depending upon the materials comprising the insulating material 33 between the light emitting elements 20, and any residual molded material 210 along these streets/lanes.

As noted above, because the support-providing thick metal layers 28, 30 do not extend within the streets/lanes separating the individual devices 100, the process and tools used to singulate the devices 100 do not experience the mechanical wear and stress that conventional processes and tools experience when singulating devices on structurally supporting submounts.

FIG. 2B illustrates an example alternative shape 212 of the dome that encapsulates the light emitting devices 100. In this example, the dome 212 is trapezoidal in profile, and will generally provide a more collimated light output, compared to the hemispherical dome 210 of FIG. 2A. Typically, the profile of dome 212 corresponds to a truncated cone shaped lens, although other three-dimensional shapes may provide a trapezoidal profile, including a truncated pyramid, and others. The processes and materials used to form the domes 212 is similar to the above described processes and materials used to form the domes 210.

One of skill in the art will recognize that the encapsulating dome may be of any of a variety of shapes, each having different optical characteristics. For example, a Fresnel lens may be molded above each light emitting device 100 to further collimate the light that is output from the light emitting device 100. In some embodiments, a side-directing lens may be formed above each light emitting device 100 to provide a light output that is substantially orthogonal to the plane of the light emitting surface of the device 100. One of skill in the art will recognize that any of a variety of optical effects may be achieved in the formation of the domes that are formed over the light emitting device 100.

In some applications, the formation of an optical encapsulation of each of the light emitting elements 100 at the wafer level may not be feasible. In some applications, the precision required to align the optical encapsulant 210, 212 to the wafer level set of light emitting elements 100 may exceed the capabilities, or cost expectations, of a light emitting device producer. In other applications, the desired light output characteristics may not be achievable in the limited area associated with each light emitting device 100 on the wafer.

In such applications, and others, it may be preferable to provide more area per device for the formation of an encapsulating optical dome. Accordingly, the self-supporting devices 100 may be singulated from the wafer then placed on an intermediate substrate that provides the extra area.

FIGS. 3A-3E illustrate example encapsulations of self-supporting light emitting devices 100 that are situated on an intermediate substrate 301, such as a conventional dicing tape.

Figure 3A:
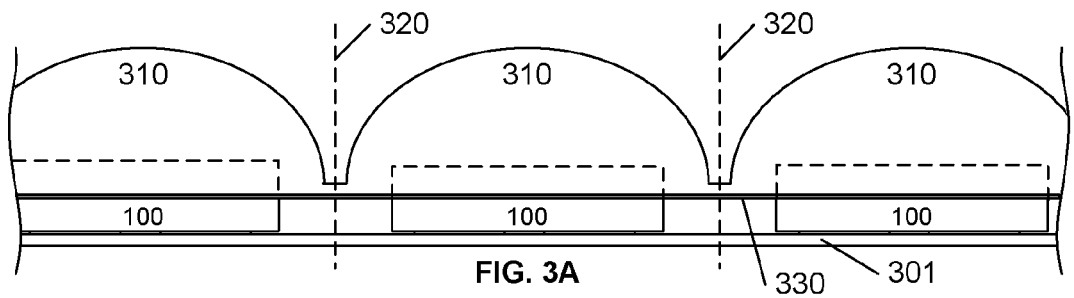
FIGS. 3A-3E illustrate example encapsulations of self-supporting light emitting devices that are situated on an intermediate substrate.

In the example of FIG. 3A, the domes 310 that encapsulate each light emitting device 100 are part of a continuous shaped film, such as the result of a concurrent mass molding of a plurality of devices 100 on a substrate 301, or the application of a preformed sheet of shaped elements 310 upon the plurality of devices 100 on the substrate 301. Alternatively, the devices 100 may be situated on a movable substrate 301, suitably spaced apart to facilitate the forming of the elements 310 around each light emitting device, and pass through an encapsulating apparatus in an assembly line fashion. Such an apparatus may apply a mold of quick-curing slurry as the optical element 310 for each device 100, or affix a preformed dome as the optical element 310 for each device 100.

In some embodiments, to improve the light output efficiency of the encapsulated device 100, a reflective layer 330 may be applied to the bottom surface of each dome 310. This reflective layer 330 reflects any light that would otherwise escape through the bottom of the dome 310 back toward the desired light output surface, in this example, the upper hemispherical surface of the dome 310.

As with the dome 210, the dome 310 (and subsequently described domes 312-318 and 450) may comprise any of a variety of materials in any of a variety of shapes, as detailed above.

FIGS. 3B-3E illustrate a variety of shapes that may be formed as domes over the devices 100. Although illustrated as singular elements, the formation of the particular shapes over the devices 100 will have preferably occurred while the devices 100 were on the intermediate substrate 301 (not illustrated in FIGS. 3B-3E).

Figure 3B:
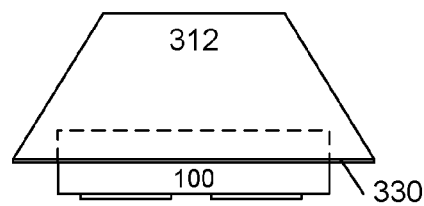

FIG. 3B illustrates a trapezoidal profile to the dome 312, commonly associated with a truncated cone shape. As illustrated, the reflective layer 330 extends around the overhang surface beyond the device 100.

Figure 3C:
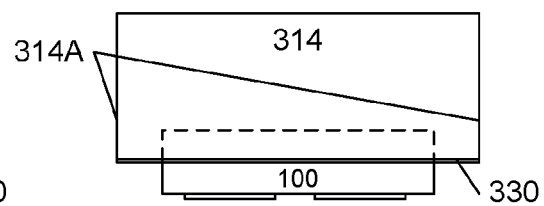

FIG. 3C illustrates a rectangular profile to the dome 314, commonly associated with a cylindrical shape or a cubic shape to the optical encapsulation.

Figure 3D:
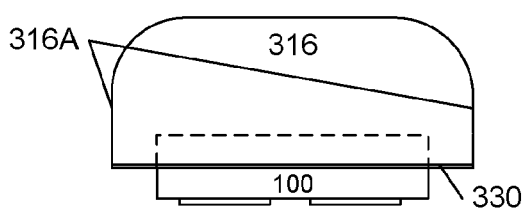

FIG. 3D illustrates a 'truncated bullet' profile to the dome 316, which may correspond to a cylindrical shape with a decreasing radius toward the top, or a cubic shape with rounded upper corners or edges.

An advantage of the profiles of FIGS. 3C and 3D is that they provide a flat vertical segment 314A and 316A that facilitates subsequent handling, placement, and alignment of the device 100 on a printed circuit board or other type of fixture to which the device 100 is being attached.

Figure 3E:
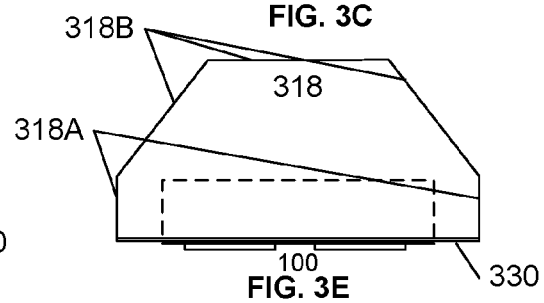

One of skill in the art will recognize that the shape of the encapsulating dome is substantially immaterial to the principles of this invention, and is dependent upon the intended application of the encapsulated device 100. For example, FIG. 3E illustrates a combination of feature shapes to achieve particular advantages. As noted above, the flat vertical surfaces 318A facilitate handling, placement, and alignment of the encapsulated device 100, and the trapezoidal profile 318B commonly associated with a truncated cone shape provides for a more collimated light output than a common hemispherical profile.

FIGS. 4A-4E illustrates an example molding process for forming encapsulations of self-supporting light emitting devices 100 that are mounted on an intermediate substrate that forms a lower mold 410 that is matched with an upper mold 420 that forms optical elements above each light emitting device 100.

Figure 4A:
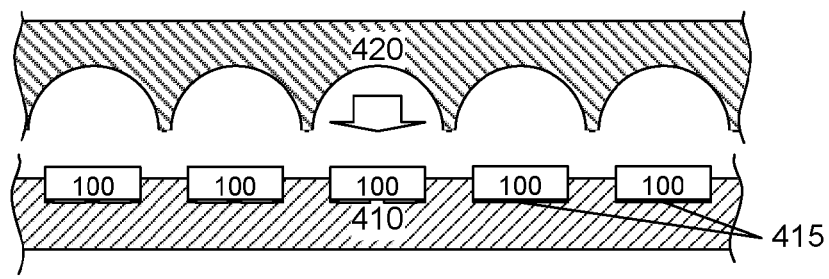
FIGS. 4A-4F illustrate an example molding process for forming encapsulations of self-supporting light emitting devices.

As illustrated in FIG. 4A, the mold 410 includes wells 415 into which the self-supporting devices 100 may be placed. Preferably, the devices 100 may be tested while situated on the wafer, and only properly functioning devices 100 will be placed into the wells 415 of the mold 410. Because the wells 415 are shaped to accept the devices 100, and the devices 100 are self-supporting when placed within these wells 415, there is no need to adhere the devices 100 to the mold 410, or otherwise support this placement of the devices in the wells 415, thereby avoiding the costs of attaching and detaching the devices 100 from the mold 410.

A corresponding mold 420 is aligned with the mold 410, and is shaped to allow for the formation of a particularly shaped encapsulating optical element, in this case an element (450 in FIGS. 4B-4E) having a hemispherical profile. The mold 420 is coupled to the mold 410, either before or after the material (450 of FIG. 4B) that forms the encapsulating optical element is placed within the space between the substrate 410 and the mold 420. Thereafter, the encapsulating material 450 is cured/set, using conventional techniques.

Figure 4B:
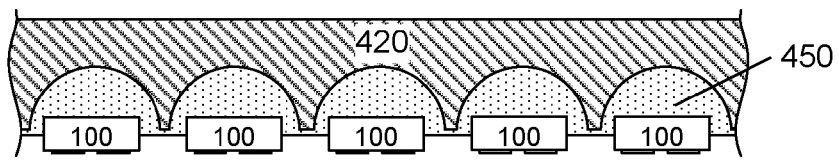
Figure 4C:
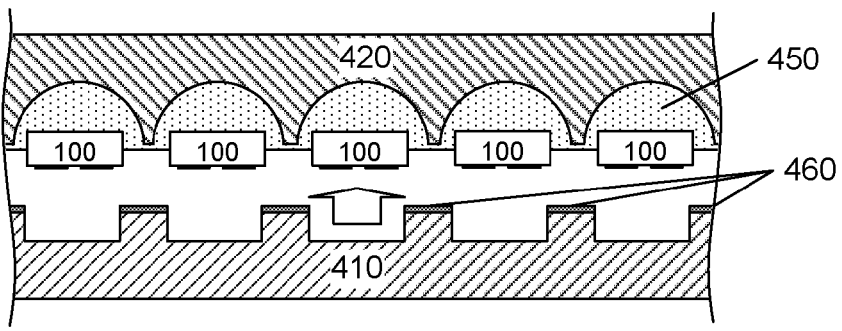
Figure 4D:
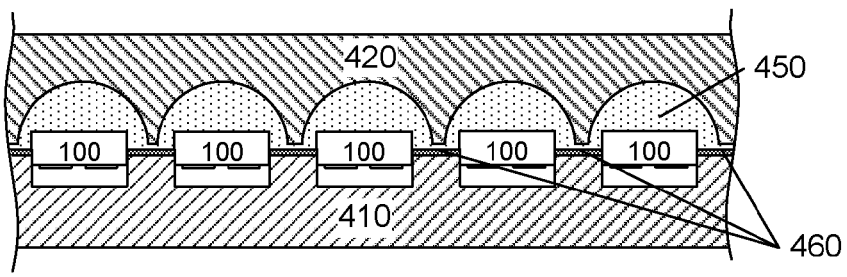

Optionally, if a reflective coating is to be applied to the bottom surface of the encapsulating material 450 and after the encapsulating material sets, the mold 410 may be removed, as illustrated in FIG. 4B, exposing the bottom surface of the encapsulating material 450. As illustrated in FIG. 4C, the mold 410, or a similar mold, may be coated with a tacky reflective coating 460, then reinserted into the gaps left between the light emitting devices 100, to coat the bottom surface of the material 450 with this reflective coating 460, as illustrated in FIG. 4D. The mold 410 is suitably coated or otherwise prepared to assure that the reflective coating 460 is released from the mold 410, to remain on the bottom surface of the material 450.

Figure 4E:
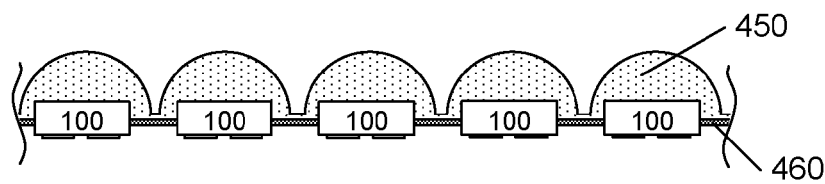

At FIG. 4E, the molds 410, 420 may be removed (after the step illustrated in FIG. 4B or FIG. 4D, depending upon whether a reflective coating was applied to the bottom surface of the encapsulating material 450). Removing the molds 410, 420 exposes the regions/streets/lanes (hereinafter 'streets') that were created by the molds 410, 420 between the light emitting devices 100. Optionally, depending upon the technique used to singulate the light emitting devices 100, the mold 410 may be maintained in place, providing a support surface in these streets for the singulation process.

Figure 4F:
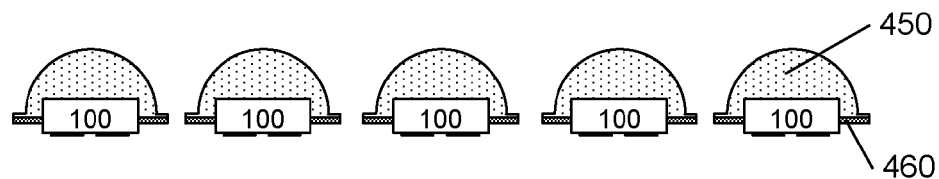

Any of a variety of techniques may be used to singulate/dice the devices 100, including mechanical sawing or cutting, laser cutting, etching, and so on. As the singulation only requires cutting through any residual encapsulating material 450 in the street, and the optionally applied reflective coating 460, the stress and wear on the singulating apparatus will be minimal. Upon singulation, individual encapsulated 450 self-supporting devices 100 with optional reflective overhangs 460 are provided, as illustrated in FIG. 4F.

Figure 5:
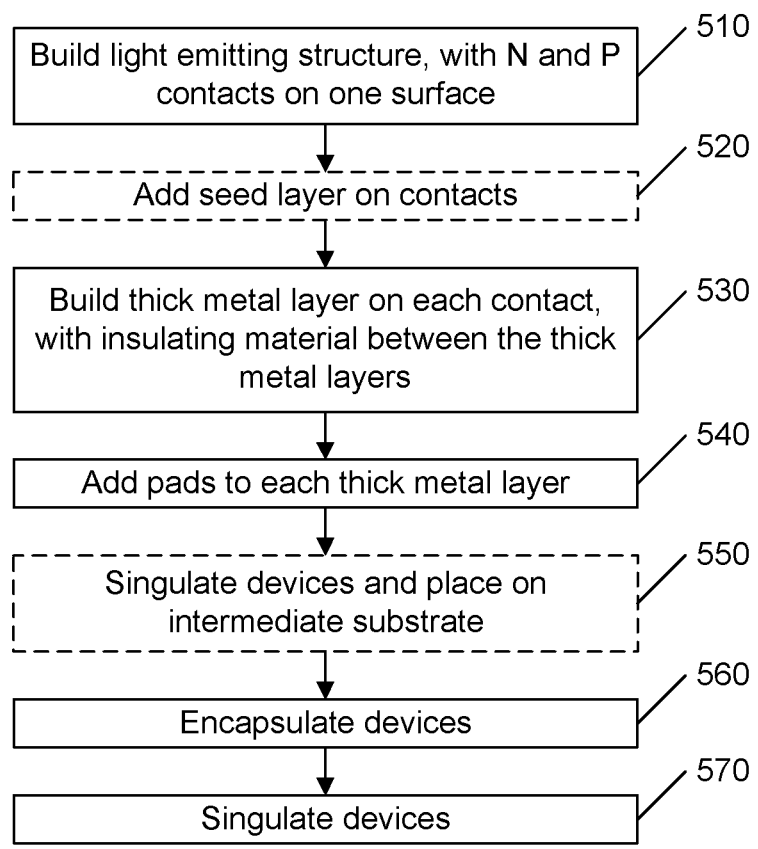
FIG. 5 illustrates an example flow diagram for the fabrication of encapsulated self-supporting light emitting devices.

FIG. 5 illustrates an example flow diagram for the fabrication of encapsulated self-supporting light emitting devices.

At 510, a conventional light emitting structure is formed with N and P contacts on the same surface of the structure.

Upon these N and P contacts, a thick metal layer is formed, at 530, with insulating material between the formed layers. If necessary a seed layer is applied to the N and P contacts to facilitate the formation of the thick metal layer, at 520.

The thick metal layer may comprise any electrically conductive material, and preferably a material that exhibits high thermal conductivity to dissipate heat generated by the light emitting structure. Suitable materials include, for example, copper, nickel, gold, palladium, nickel-copper alloy, or other metals and alloys.

At 540, pads are formed on these thick metal pillars to facilitate external connection to the light emitting device 100. Depending upon the material used for forming the thick metal layers, the pads may merely be an extension of the pads beyond the aforementioned insulating material between the metal layers, or they may be a material selected to satisfy particular requirements, such as the requirement to provide non-oxidizing material, such as gold, as the external contacts. Each pad may occupy a surface area greater or smaller than the surface area of the corresponding thick metal layer, depending upon the dimensional requirements of the particular application for the device.

If the desired encapsulation of the device exceeds the dimensions available at the wafer-level, the devices are singulated and placed on an intermediate substrate, at 550.

At 560, the devices are encapsulated, while upon the wafer, or upon the intermediate substrate. After encapsulation, the devices are singulated, at 570, as detailed above. Of particular note, regardless of whether the encapsulation occurs on the wafer or the intermediate substrate, the singulation does not require slicing/dicing through a supporting submount, thereby substantially reducing the stress and wear on the apparatus used to perform the singulation.

While the invention has been illustrated and described in detail in the drawings and foregoing description, such illustration and description are to be considered illustrative or exemplary and not restrictive; the invention is not limited to the disclosed embodiments.

For example, it is possible to operate the invention in an embodiment wherein the encapsulation includes the application of a preformed sheet over a group of light emitting devices on an intermediate substrate, wherein the group of light emitting devices is selected based on a common light emitting characteristic, and the preformed sheet is selected based on this common light emitting characteristic. U.S. Pat. No. 7,344,952, "Laminating Encapsulant Film Containing Phosphor Over LEDs", issued 3 Jul. 2008 to Haryanto Chandra, and incorporated by reference herein, discloses a technique for laminating a phosphor film to a set of light emitting devices on a submount. A variety of phosphor films are preformed, with varying wavelength conversion properties. Light emitting dies are tested and sorted ('binned') based on their light output characteristics, and dies having similar characteristics are attached to a submount. Thereafter, a particular phosphor film is selected to be applied to the dies on the submount with similar characteristics, so that the combination of the particular light emission of the light emitting dies and wavelength conversion of the selected phosphor film provide a desired composite light output. By pairing a group of similarly performing light emitting dies with a phosphor composition that is selected based on the particular characteristics of the group, the variance of the composite light output is substantially reduced.

Additionally, although the example embodiments illustrate a single thick metal layer above each of the N and P contacts, one of skill in the art will recognize that this thick metal layer may comprise a plurality of individual thick metal pillars, and that other thick metal layers may be formed that are not coupled to the N and P contacts, as disclosed in the above referenced copending application of Jipu Lei et al.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A method comprising:
 forming a plurality of self-supporting light emitting devices on a first substrate, each self-supporting light emitting device including thick metal layers that have a thickness of at least 50 microns to provide this self-support,
 removing the first substrate,
 singulating the plurality of self-supporting light emitting devices,
 placing the plurality of self-supporting light emitting elements into wells of an intermediate substrate, without adhering the light emitting elements to the intermediate substrate,
 encapsulating the plurality of self-supporting light emitting devices to form a plurality of encapsulated self-supporting light emitting devices,
 removing the intermediate substrate, and
 singulating the plurality of encapsulated self-supporting light emitting devices to provide individual encapsulated self-supporting light emitting devices.

2. The method of claim 1, wherein the placing the plurality of self-supporting light emitting devices includes selecting the plurality of self-supporting light emitting devices based on a common light emitting characteristic.

3. The method of claim 2, wherein the encapsulating includes selecting a preformed sheet based on the common light emitting characteristic, and applying the preformed sheet over the plurality of self-supporting light emitting devices.

4. The method of claim 1, wherein the encapsulating includes forming an encapsulating structure of at least one of epoxy, silicone, and glass over each self-supporting light emitting device.

5. The method of claim 4, including providing a layer of wavelength-conversion material between the self-supporting light emitting device and the encapsulating structure.

6. The method of claim 1, wherein the encapsulating includes forming a structure that includes a wavelength-conversion material over each self-supporting light emitting device.

7. The method of claim 1, wherein the encapsulating includes applying a preformed sheet over the plurality of self-supporting light emitting devices.

8. The method of claim 1, wherein the encapsulating includes forming a plurality of hemispherical domes.

9. The method of claim 1, wherein the encapsulating includes applying an encapsulant material that extends between the self-supporting light emitting devices.

10. The method of claim 9, including applying a reflective material to the encapsulant material between the self-supporting light emitting devices before singulating the plurality of encapsulated self-supporting light emitting devices.

11. The method of claim 10, wherein applying the reflective material includes placing the reflective material on a mold, then applying the mold to the encapsulant material.

12. The method of claim 11, wherein the intermediate substrate is the mold.

* * * * *